US 11,746,408 B2

(12) United States Patent
Quinn et al.

(10) Patent No.: US 11,746,408 B2
(45) Date of Patent: *Sep. 5, 2023

(54) MODULAR CONFINED ORGANIC PRINT HEAD AND SYSTEM

(71) Applicant: Universal Display Corporation, Ewing, NJ (US)

(72) Inventors: William E. Quinn, Whitehouse Station, NJ (US); Gregory Mcgraw, Yardley, PA (US); Matthew King, Moorestown, NJ (US); Gregg Kottas, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 27 days.

This patent is subject to a terminal disclaimer.

(21) Appl. No.: 17/389,694

(22) Filed: Jul. 30, 2021

(65) Prior Publication Data

US 2021/0355575 A1 Nov. 18, 2021

Related U.S. Application Data

(63) Continuation of application No. 16/255,040, filed on Jan. 23, 2019, now Pat. No. 11,104,988.

(Continued)

(51) Int. Cl.
*C23C 14/22* (2006.01)
*C23C 14/12* (2006.01)
(Continued)

(52) U.S. Cl.
CPC ............ *C23C 14/228* (2013.01); *C23C 14/12* (2013.01); *C23C 14/243* (2013.01); *H10K 50/11* (2023.02); *H10K 71/10* (2023.02); *H10K 2101/40* (2023.02)

(58) Field of Classification Search
CPC ..... C23C 14/228; C23C 14/12; C23C 14/243; C23C 14/24; C23C 14/04; C23C 16/54;
(Continued)

(56) References Cited

U.S. PATENT DOCUMENTS 4,769,292 A    9/1988  Tang
5,122,391 A *  6/1992  Mayer ................... C23C 16/453
                                                       427/255.35

(Continued)

FOREIGN PATENT DOCUMENTS

WO    2008057394 A1   5/2008
WO    2010011390 A2   1/2010

OTHER PUBLICATIONS

Baldo et al. Highly efficient phosphorescent emission from organic electroluminescent devices, Nature, vol. 395, pp. 151-154, 1998.

(Continued)

*Primary Examiner* — Rudy Zervigon
(74) *Attorney, Agent, or Firm* — Butzel Long

(57) ABSTRACT

Embodiments of the disclosed subject matter provide a vapor distribution manifold that ejects organic vapor laden gas into a chamber and withdraws chamber gas, where vapor ejected from the manifold is incident on, and condenses onto, a deposition surface within the chamber that moves relative to one or more print heads in a direction orthogonal to a platen normal and a linear extent of the manifold. The volumetric flow of gas withdrawn by the manifold from the chamber may be greater than the volumetric flow of gas injected into the chamber by the manifold. The net outflow of gas from the chamber through the manifold may prevent organic vapor from diffusing beyond the extent of the gap between the manifold and deposition surface. The manifold may be configured so that long axes of delivery and exhaust apertures are perpendicular to a print direction.

14 Claims, 15 Drawing Sheets

Related U.S. Application Data

(60) Provisional application No. 62/633,797, filed on Feb. 22, 2018.

(51) Int. Cl.
*C23C 14/24* (2006.01)
*H10K 50/11* (2023.01)
*H10K 71/10* (2023.01)
*H10K 101/40* (2023.01)

(58) Field of Classification Search
CPC ............ C23C 16/545; C23C 16/45551; C23C 14/568; C23C 16/455; C23C 16/45578; H01L 51/5004; H01L 51/0002; H01L 21/67173; H01L 21/68764; H01L 21/67184; H01L 21/67745; H01L 21/6776; B41J 2/1433; B41J 2/165; B41J 2/16517; B41J 2/16579; B41J 2202/12; B41J 2202/15; B41J 2202/16; B41J 2/135; B41J 2/2142
USPC ................ 118/719, 718; 216/27; 156/345.2, 156/345.22
See application file for complete search history.

(56) References Cited

U.S. PATENT DOCUMENTS

| | | |
|---|---|---|
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,962 B2 | 10/2008 | De Winter |
| 7,431,968 B1 | 10/2008 | Shtein |
| 7,968,146 B2 | 6/2011 | Wagner |
| 9,149,988 B2 * | 10/2015 | Mark ...................... B29C 70/20 |
| 9,175,393 B1 | 11/2015 | Higashi |
| 11,104,988 B2 * | 8/2021 | Quinn .................. C23C 14/228 |
| 2003/0230980 A1 | 12/2003 | Forrest |
| 2004/0174116 A1 | 9/2004 | Lu |
| 2008/0075859 A1* | 3/2008 | Baker .................. B41J 11/0015 |
| | | 425/105 |
| 2009/0214783 A1* | 8/2009 | Forrest .................... C23C 14/04 |
| | | 427/255.6 |
| 2010/0037820 A1 | 2/2010 | Lee |
| 2010/0245479 A1 | 9/2010 | Forrest |
| 2011/0097489 A1* | 4/2011 | Kerr .................. C23C 16/45591 |
| | | 427/248.1 |
| 2012/0097495 A1 | 4/2012 | Moore |
| 2015/0376787 A1* | 12/2015 | Mcgraw ................ C23C 14/228 |
| | | 118/724 |
| 2015/0376797 A1 | 12/2015 | Chen |
| 2015/0380648 A1* | 12/2015 | Mcgraw .................. C23C 14/12 |
| | | 118/712 |
| 2017/0101711 A1* | 4/2017 | Mcgraw .............. H01L 51/0005 |
| 2017/0229663 A1 | 8/2017 | Tsai |
| 2019/0232325 A1* | 8/2019 | Mcgraw ................ C23C 16/455 |
| 2020/0235296 A1* | 7/2020 | Mcgraw .................. C23C 14/12 |
| 2021/0054495 A1* | 2/2021 | Mcgraw .................. B41J 2/045 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

S. Biswas et al., Solvent-free, direct printing of organic semiconductors in atmosphere. App. Phys. Lett. 96 263301 (2010), 4 pages.

M. S. Arnold et al., "Direct vapor jet printing of three color segment organic light emitting devices for white light illumination," Applied Physics Letters 92, 053301 (2008), 4 pages.

D. F. Fairbanks et al., "Diffusion Coefficients in Multicomponent Gas Mixtures", Indust. Chem. Eng., v42, n3, p. 471-475 (Mar. 1950).

H. Yamamoto et al., "Identification of device degradation positions in multi-layered phosphorescent organic light emitting devicdes using water probes", Appl. Phys. Lett. 100, 183306 (2012), doi: 10.1063/1.4711129 (2012), 5 pages.

Erickson et al., "Engineering Efficiency Roll-Off in Organic Light Emitting Devices" Advanced Functional Materials, 2014, pp. 6074-6080.

William M. Deen, "Analysis of Transport Phenomena", Oxford University Press (1998). p. 16 ISBN 978-0195084948.

\* cited by examiner

MODULAR CONFINED ORGANIC PRINT HEAD AND SYSTEM

CROSS-REFERENCE TO RELATED APPLICATIONS

This application is a continuation of U.S. patent application Ser. No. 16/225,040 filed Jan. 23, 2019, which claims priority to U.S. Patent Application Ser. No. 62/633,797, filed Feb. 22, 2018, the entire contents of each are incorporated herein by reference.

FIELD

The present invention relates to a confined organic printing (COP) system that can be added to a substrate processing chamber, and methods of making organic light emitting diodes/devices (OLEDs) and other optoelectronic device using this chamber.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a system may include a vapor distribution manifold that ejects organic vapor laden gas into a chamber and withdraws chamber gas. The vapor ejected from the manifold may be incident on, and may condense onto, a deposition surface within the chamber that moves relative to one or more print heads in a direction orthogonal to a platen normal and a linear extent of the manifold. The volumetric flow of gas withdrawn by the manifold from the chamber may be greater than the volumetric flow of gas injected into the chamber by the manifold. The net outflow of gas from the chamber through the manifold may prevent organic vapor from diffusing beyond the extent of the gap between the manifold and deposition surface. The manifold may be configured so that long axes of delivery and exhaust apertures are perpendicular to a print direction.

The manifold may include one or more delivery apertures. The one or more delivery apertures may be surrounded by exhaust apertures disposed between the delivery apertures and an edge of the manifold. The vapor distribution manifold may be formed from perforated sheets of metal. The vapor distribution manifold may include one or more heated organic vapor sources. The vapor distribution manifold may be joined to a surrounding chamber wall via one or more connections, and wherein the connections are not heated. The vapor may be ejected to form a deposition on the deposition surface has a flow where a Péclet number Pe<10 with respect to a binary diffusivity of a delivery gas and a confinement gas.

The system may have a process chamber that includes the vapor distribution manifold and an aperture assembly of the one or more print heads that both ejects organic vapor laden inert delivery gas into the process chamber and withdraws chamber gas. The vapor distribution manifold may eject vapor that is incident on, and condenses onto, a deposition surface within the process chamber. The deposition surface may be configured to move relative to the print head in a direction orthogonal to the deposition surface normal and a linear extent of the vapor distribution manifold. A net outflow of gas from the process chamber through the vapor distribution manifold may prevent organic vapor from diffusing beyond a gap between the manifold and the deposition surface. The aperture assembly may balance a deposition flow and an exhaust flow so that deposition material is confined to an area under the one or more print heads. The process chamber may be cold-walled. The process chamber may include at least one of organic vapor jet printing (OVJP) equipment and metrology equipment. The process chamber may include at least one confined organic printer (COP) head and at least one organic vapor jet printing (OVJP) head. The process chamber may be operated at a pressure of between 50 and 300 Torr. The process chamber may be operated at a pressure of between 20 and 800 Torr. The ejected vapor may be incident on, and may condense onto, the deposition surface within the process chamber without a shadow mask.

At least one of the one or more print heads of the system may deposit different organic species from the other print heads. At least one of the one or more print heads deposits the same organic species in the same ratio or in different ratios than the other heads of the plurality of COP heads. The one or more print heads may be adjacent to at least one selected from the group consisting of: a common cold plate, and a confinement gas distribution manifold. The deposition surface may be a platen. The platen may be configured to hold a substrate. The platen may be configured to be cooled by a cooling device. The deposition surface may be a portion of a roll of flexible material.

The system may include a deposition aperture to deposit gaseous precursors or substances as deposition materials, and the deposition materials may be confined to a volume defined by the area under the deposition apertures by a confining flow and localized exhaust. A shape of the deposition aperture may have a first axis that is 10 times greater in length than a second axis. A shape of the deposition aperture may be amorphous. A shape of the deposition aperture may match an unmasked area of a substrate on which the deposition materials are deposited. The unmasked area may define an active device. The unmasked area may have been previously processed. A masked area may protect the substrate from the deposition materials. The masked area may be removed after the deposition materials are deposited, where the removal of the masked area is by subsequent processing.

According to an embodiment, a method may include fabricating an organic light emitting device (OLED). The method may include depositing a hole transport layer (HTL) with a selective area confined organic printer (COP) in a process chamber that includes an organic vapor jet printing (OVJP) print apparatus, and depositing at least one emissive layer with the OVJP print apparatus when the deposition of the HTL is completed.

According to an embodiments, a method may include fabricating an organic light emitting device (OLED). The method may include depositing a hole transport layer (HTL) with a selective area confined organic printer (COP) in a process chamber that includes an organic vapor jet printing (OVJP) print apparatus, and depositing the at least one emissive layer concurrently with the HTL, but on top of the HTL layer, where the HTL is deposited by COP and the EML is deposited by OVJP.

According to an embodiment, a method may include fabricating an organic light emitting device (OLED) using one or more confined organic printer (COP) heads. The method may include depositing an organic thin film layer with graded doping in a plurality of passes by depositing material of varying composition with each pass, where the composition of the material deposited by a single COP head of the one or more COP heads varies with each pass.

According to an embodiment, a method may include fabricating an organic light emitting device (OLED) using confined organic printer (COP) heads. The method may include depositing an organic thin film layer with graded doping in a plurality of passes by depositing material of varying composition with each pass, where a plurality of the COP heads deposit the material of different composition on a substrate in series, wherein the material composition deposited by each COP head is constant in time. The method may include depositing a plurality of organic layers containing different chemical species with the plurality of COP heads.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
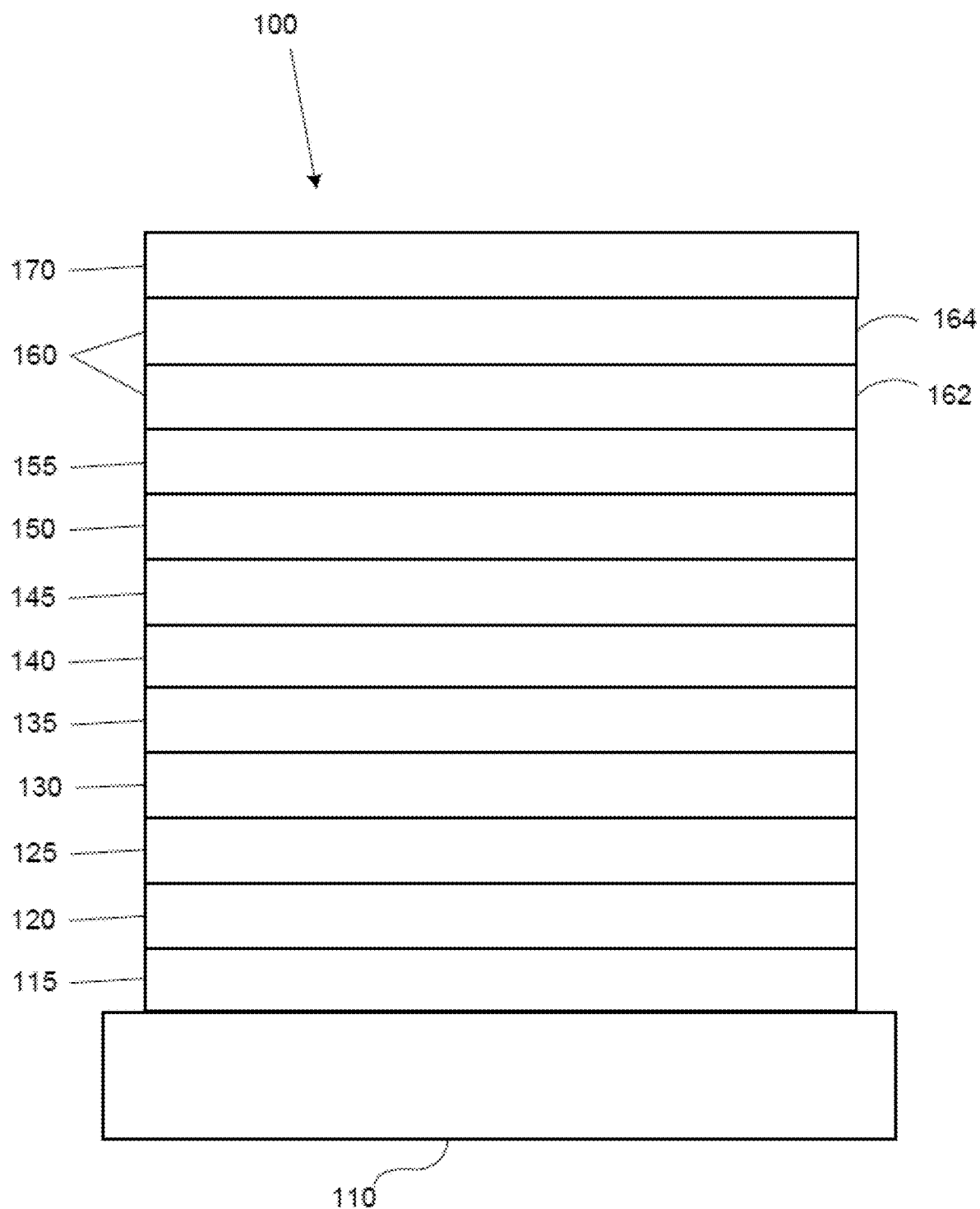
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
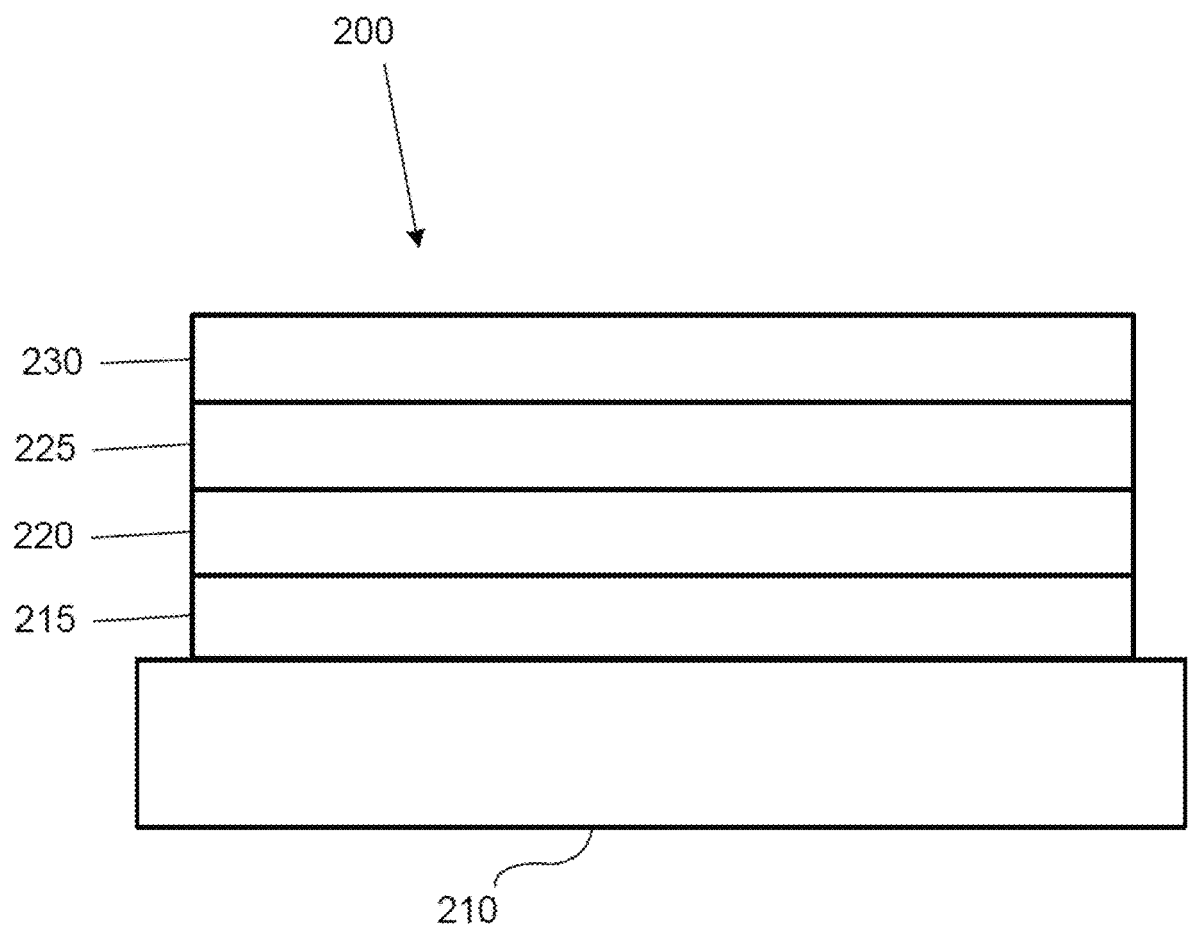
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Figure 3:
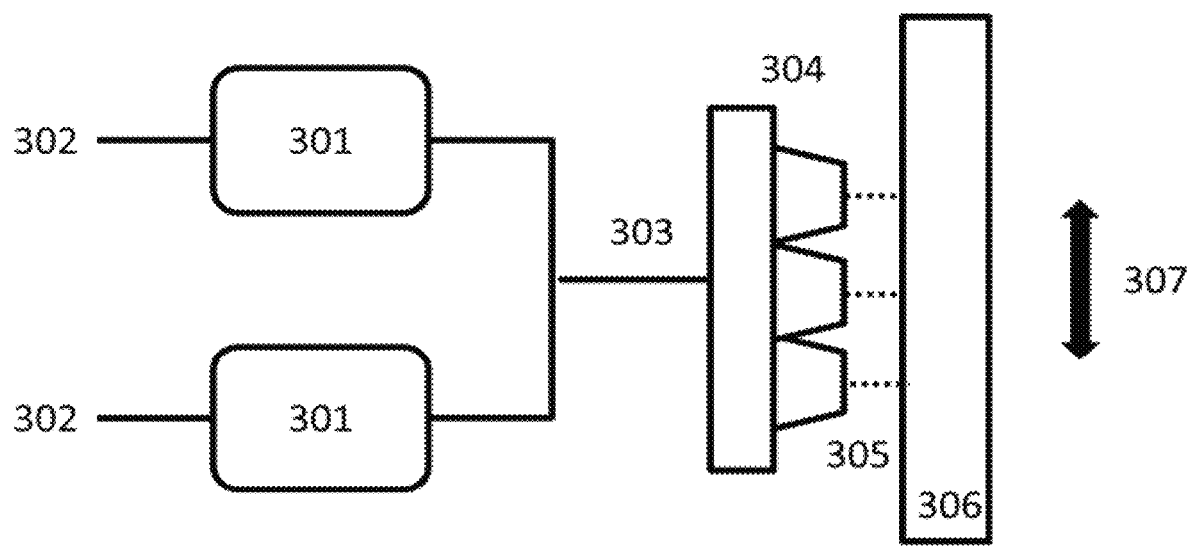
FIG. 3 shows an organic vapor jet printing (OVJP) process flow.

Organic vapor jet printing (OVJP) is a technique for producing precisely patterned organic thin films on a substrate without the use of solvents or shadow masks, and FIG. 3 shows an OVJP process flow. Organic materials may be evaporated in heated furnaces 301 and entrained in streams of inert carrier gas 302 henceforth referred to as delivery gas. Delivery gas steams may combine in a mixing zone 303 to enable co-deposition of host and dopant materials from different source ovens. The mixed gas and vapor stream may be collimated by an array of one or more nozzles 304 into jets 305 that carry the vapor to the substrate 306. The organic vapors may condense into well-defined spots of thin film on the regions of the substrate where the jets impinge. Patterns of organic thin film may be drawn by moving the substrate relative to the nozzle assembly. This technique is disclosed in U.S. Pat. No. 7,431,962. It is typically used for drawing arrays of disconnected features, rather than broad area patterning.

Early implementations of the OVJP process had overspray of organic material that failed to deposit in the intended printing zone. This may be remedied using DEC (delivery-exhaust-confinement) depositors that use a confinement flow to block the spread of surplus organic vapor underneath the nozzle array and sweep it into exhaust channels for removal, as described in U.S. Patent Publn. No. 2015/0376787.

Figure 4:
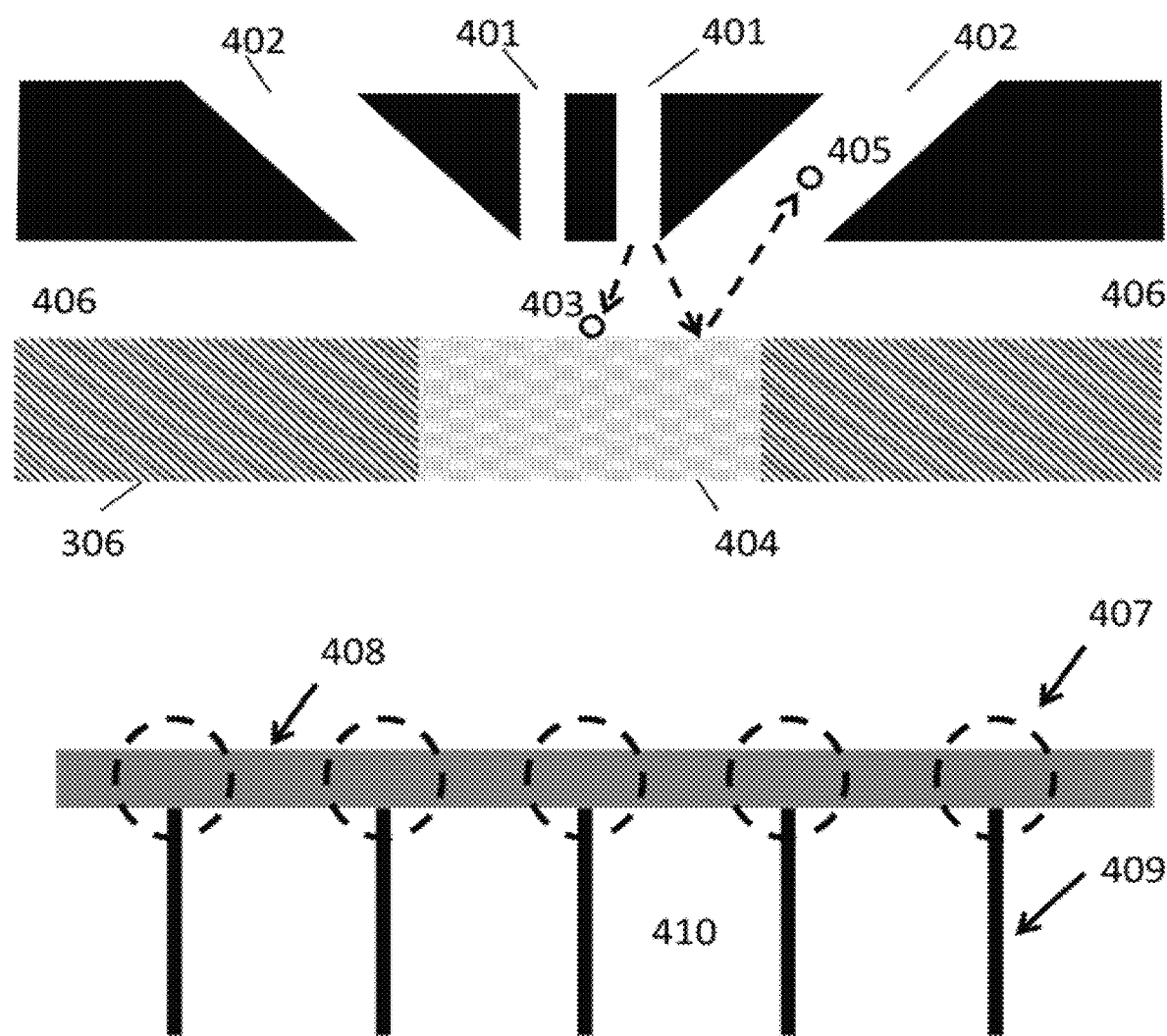
FIG. 4 shows a delivery-exhaust-confinement (DEC) type OVJP print head.

FIG. 4 shows a delivery-exhaust-confinement (DEC) type OVJP print head. Each depositor may include one or more delivery apertures 401 that inject organic laden delivery gas onto a deposition zone. The apertures may be surrounded by associated exhaust apertures 402 that withdraw the delivery and confinement flows, along with excess organic vapor, from the deposition zone. A portion of the organic material 403 ejected by the delivery aperture may condense on the substrate within the desired printing zone 404. Molecules of organic vapor 405 that fail to adhere to the substrate may be flushed away from the substrate through the exhaust aperture. Confinement gas may enter from the edges of the depositor 406 to push surplus organic vapor into the exhaust channels. No substantial exchange of organic vapor may take place between each depositor and the volume of gas surrounding it. These isolated depositors 407 may be typically arranged in a linear array 408 coplanar with a substrate that is perpendicular to the direction of motion during printing. This results in an array of printed stripes 409 which may have no significant deposition of organic material in the regions between stripes 410. Confinement and exhaust flows may act to isolate regions of intended deposition both from each other and from their surrounding environment. Depositors may perform similarly regardless of whether they are situated near the ends or the midline of the array.

Because each depositor may be isolated from its surroundings, the DEC system may prevent the chamber from becoming contaminated by excess organic material from the printing process. While this generally may not be a concern when printing small features, it may potentially be an important for a tool for printing larger features. A deposition tool for printing wide stripes of uniformly thick thin film with well-defined edges may be used to deposit continuous films such as the transport layers of an OLED array. OVJP systems that deposit large (>1 mm) features exist (Arnold et al. 2008) (Biswas et al. 2012), however overspray control may be generally poor. Furthermore, the thickness profiles of printed features may tend to be Gaussian as opposed to the mesa shaped profiles desired for organic optoelectronic devices, which are more uniform across the deposition zone.

Large area organic thin films may be generally deposited from the vapor phase by either VTE (vacuum thermal evaporation) or OVPD (organic vapor phase deposition). Both techniques may use shadow masks to prevent organic material from being deposited in regions of a substrate where it would be detrimental, such as encapsulation regions or busline contacts. Both techniques may contaminate their deposition chambers. Organic material in VTE may spread by line of sight from the heated source, and OVPD reactors may be permeated with organic vapor entrained in hot carrier gas. This may usually preclude using a single OVPD or VTE chamber to deposit multiple materials in a production setting. The walls of an OVPD reactor may be typically heated to prevent the condensation of organic material onto the chamber walls. Both OVPD and VTE may have difficulty achieving uniform deposition over a large substrate.

The embodiments of the disclosed subject matter address problems of masking, uniformity, and chamber contamination may exist for large-area organic thin film deposition techniques. Confined organic printing (COP) may be an adaption of DEC OVJP for printing intermediate to large size features (0.001-1 m). Instead of using the microenvironments created by confinement flow to isolate multiple depositors and prevent cross-contamination between printed features, COP may use confinement flow to isolate a single deposition zone from the surrounding chamber. This may be achieved by changing the orientation of the delivery and exhaust apertures so that they are perpendicular to the direction of printing, rather than parallel as they are in DEC OVJP.

This change of depositor orientation may replace the narrow nozzle of most OVJP implementations with a broad deposition aperture that distributes delivery flow evenly across the width of the deposition zone. It may be analogous to a slot die coater used in solvent based processing. This configuration may allow wide features to be printed in a single pass with excellent film thickness uniformity. COP may provide improved scaling over competing technologies, since larger substrates may be coated by simply stitching together larger raster patterns without increasing the area of the depositor. COP may deposit organic thin films with well-defined edges. This may eliminate the need for using shadow masks, as well as their associated hardware and process steps, in low-resolution patterning applications.

Embodiments of the disclosed subject matter may make it possible to perform multiple processing steps within the same chamber. COP may be integrated into the same chamber as both OVJP and metrology processes. The disclosed embodiments providing multiple process steps within the same chamber may provide many economic and technical advantages. Firstly, the embodiments of the disclosed subject matter may lower capital costs by using fewer process vessels, and correspondingly fewer loadlocks, valves, substrate handling robots, and the like. Secondly, substrates may be moved between process steps more rapidly if complex transfers are not needed, thereby reducing TAKT time. Finally, being able to rapidly transition between process steps may reduce the potential for sensitive heterojunctions to become contaminated during the lag time between the applications of each layer. Contamination of the hole transport layer to emissive layer interface, for example, may significantly reduce the lifetime of OLEDs (Yamamoto et al. 2012). Multiple COP heads may be used to deposit a multilayer organic thin film in a single chamber. Since a relatively small area of substrate is printed at a time, the heads may be deployed to minimize the time interval between the deposition of the first and last organic film layer at each region of the substrate. Harmful exposure to the chamber ambient may be minimized.

COP may advantageously sequester captured material in one place for reprocessing, providing economic and environmental advantages.

A confined organic printer (COP) may be configured to work in a multi-process chamber without contaminating the chamber or surrounding process equipment with organic material. To eliminate chamber contamination, the COP head may contain delivery gas distribution, evacuate the delivery gas and any non-condensed organic material, and prevent delivery gas and organic material from escaping the COP deposition zone. This may be achieved by using three separate gas flows. The first gas flow may be a delivery gas saturated with organic vapor which flows through a centrally located aperture in a direction normal to the substrate surface. The second gas flow may be an evacuation flow (vacuum) surrounding the carrier gas aperture. The third gas flow may be a confinement flow, drawn inward along the substrate surface from the gas ambient surrounding the deposition zone towards the exhaust aperture. The confinement flow may prevent contamination of the process chamber by sweeping delivery gas and any organic material that has not condensed on the substrate surface outward through the exhaust aperture.

The operation of the COP head may be similar to the OVJP process described in U.S. Patent Publn. No. 2015/0376797. A distinction between the two techniques is the COP print head of the embodiments of the disclosed subject matter may deposit over a larger area than OVJP. In the case of OVJP, the primary function of confinement flow may be to isolate adjacent zones of the substrate surface from each other in order to eliminate the overspray of organic vapor onto regions of substrate where deposition is not desired. In the case of COP, however, the confinement flow may act to isolate the surrounding chamber from the deposition zone on the substrate, rather than enable printing of fine features on the substrate. The COP head may deposit contiguous zone on the substrate defined by the delivery and exhaust aperture lengths. The edges of the features printed by COP may not be as sharp as those printed by OVJP. However, the resolution that may be achieved by COP is such that it generally does not use shadow masks to confine the area of deposition.

The velocity of the organic vapor may be high in the case of OVJP, when forming a jet. The velocity in organic vapor may be low in the case of COP, when no jet is formed. Convective transport may not dominate over binary gas diffusivity between delivery and confinement flows. In embodiments of the disclosed subject matter, the system may be configured such that $Pe<1$, where $Pe$ is the Péclet number of the system. The Péclet number indicates the ratio of convective to diffusive mass transport in a flowing mixture. It is defined in this case as $Pe=lu/D$ where $l$ is the characteristic length, $u$ is the characteristic velocity of the delivery gas, and $D$ is the binary diffusivity of helium delivery gas in argon confinement gas. In an example embodiment, $l=1$ mm, $u=0.025$ to $0.25$ m/s, and $D=1\times10^{-4}$ m²/s, as may be typical for a COP head operating with He delivery and Ar confinement gas. Pe may be between 0.25 and 0.025 in this case. So long as Pe is of order unity or less, convective transport may not dominate diffusive transport of delivery and confinement gas.

Embodiments of the disclosed subject matter shown in FIGS. 5-15 may provide a system may include a vapor distribution manifold that ejects organic vapor laden gas into a chamber and withdraws chamber gas. The vapor ejected from the manifold may be incident on, and may condense onto, a deposition surface within the chamber that moves relative to one or more print heads in a direction orthogonal to a platen normal and a linear extent of the manifold. The volumetric flow of gas withdrawn by the manifold from the chamber may be greater than the volumetric flow of gas injected into the chamber by the manifold. The net outflow of gas from the chamber through the manifold may prevent organic vapor from diffusing beyond the extent of the gap between the manifold and deposition surface. The manifold may be configured so that long axes of delivery and exhaust apertures are perpendicular to a print direction.

The manifold may include one or more delivery apertures. The one or more delivery apertures may be surrounded by exhaust apertures disposed between the delivery apertures and an edge of the manifold. The vapor distribution manifold may be formed from perforated sheets of metal and may include one or more heated organic vapor sources. The vapor distribution manifold may be joined to a surrounding chamber wall via one or more connections which may not be heated. The vapor may be ejected to form a deposition on the deposition surface has a flow where a Péclet number $Pe<10$ with respect to a binary diffusivity of a delivery gas and a confinement gas.

Embodiments of the disclosed subject matter may include a system having a process chamber that includes the vapor distribution manifold and an aperture assembly of the one or more print heads that both ejects organic vapor laden inert delivery gas into the process chamber and withdraws chamber gas. The vapor distribution manifold may eject vapor that is incident on, and condenses onto, a deposition surface within the process chamber. The deposition surface may be configured to move relative to the print head in a direction orthogonal to the deposition surface normal and a linear extent of the vapor distribution manifold. A net outflow of gas from the process chamber through the vapor distribution manifold may prevent organic vapor from diffusing beyond a gap between the manifold and the deposition surface. The aperture assembly may balance a deposition flow and an exhaust flow so that deposition material is confined to an area under the one or more print heads.

The process chamber of the system may be cold-walled. The process chamber may include at least one of organic vapor jet printing (OVJP) equipment and metrology equipment. The process chamber may include at least one confined organic printer (COP) head and at least one organic vapor jet printing (OVJP) head. The process chamber may be operated at a pressure of between 50 and 300 Torr, or may be operated at a pressure of between 20 and 800 Torr. The ejected vapor may be incident on, and may condense onto, the deposition surface within the process chamber without a shadow mask.

At least one of the one or more print heads of the system may deposit different organic species from the other print heads. At least one of the one or more print heads deposits the same organic species in the same ratio or in different ratios than the other heads of the plurality of COP heads. The one or more print heads may be adjacent to at least one selected from the group consisting of: a common cold plate, and a confinement gas distribution manifold. The deposition surface may be a platen. The platen may be configured to hold a substrate. The platen may be configured to be cooled by a cooling device. The deposition surface is a portion of a roll of flexible material.

The system may include a deposition aperture to deposit gaseous precursors or substances as deposition materials, and the deposition materials may be confined to a volume defined by the area under the deposition apertures by a confining flow and localized exhaust. A shape of the deposition aperture may have a first axis that is 10 times greater in length than a second axis. A shape of the deposition aperture may be amorphous. A shape of the deposition aperture may match an unmasked area of a substrate on which the deposition materials are deposited. The unmasked area may define an active device. The unmasked area may have been previously processed. A masked area may protect the substrate from the deposition materials. The masked area may be removed after the deposition material are deposited, where the removal of the masked area is by subsequent processing.

Embodiments of the disclosed subject matter may include a method of fabricating an organic light emitting device (OLED). The method may include depositing a hole transport layer (HTL) with a selective area confined organic printer (COP) in a process chamber that includes an organic vapor jet printing (OVJP) print apparatus and depositing at least one emissive layer with the OVJP print apparatus when the deposition of the HTL is completed.

Embodiments of the disclosed subject matter may include a method of fabricating an organic light emitting device (OLED). The method may include depositing a hole transport layer (HTL) with a selective area confined organic printer (COP) in a process chamber that includes an organic vapor jet printing (OVJP) print apparatus, and depositing the at least one emissive layer concurrently with the HTL, but on top of the HTL layer, where the HTL is deposited by COP and the EML is deposited by OVJP.

A method may include fabricating an organic light emitting device (OLED) using one or more confined organic printer (COP) heads. The method may include depositing an organic thin film layer with graded doping in a plurality of passes by depositing material of varying composition with each pass, where the composition of the material deposited by a single COP head of the one or more COP heads varies with each pass.

In embodiments of the disclosed subject matter, a method may include fabricating an organic light emitting device (OLED) using confined organic printer (COP) heads. The method may include depositing an organic thin film layer with graded doping in a plurality of passes by depositing material of varying composition with each pass, where a plurality of the COP heads deposit the material of different composition on a substrate in series, wherein the material composition deposited by each COP head is constant in time. The method may include depositing a plurality of organic layers containing different chemical species with the plurality of COP heads.

Figure 5:
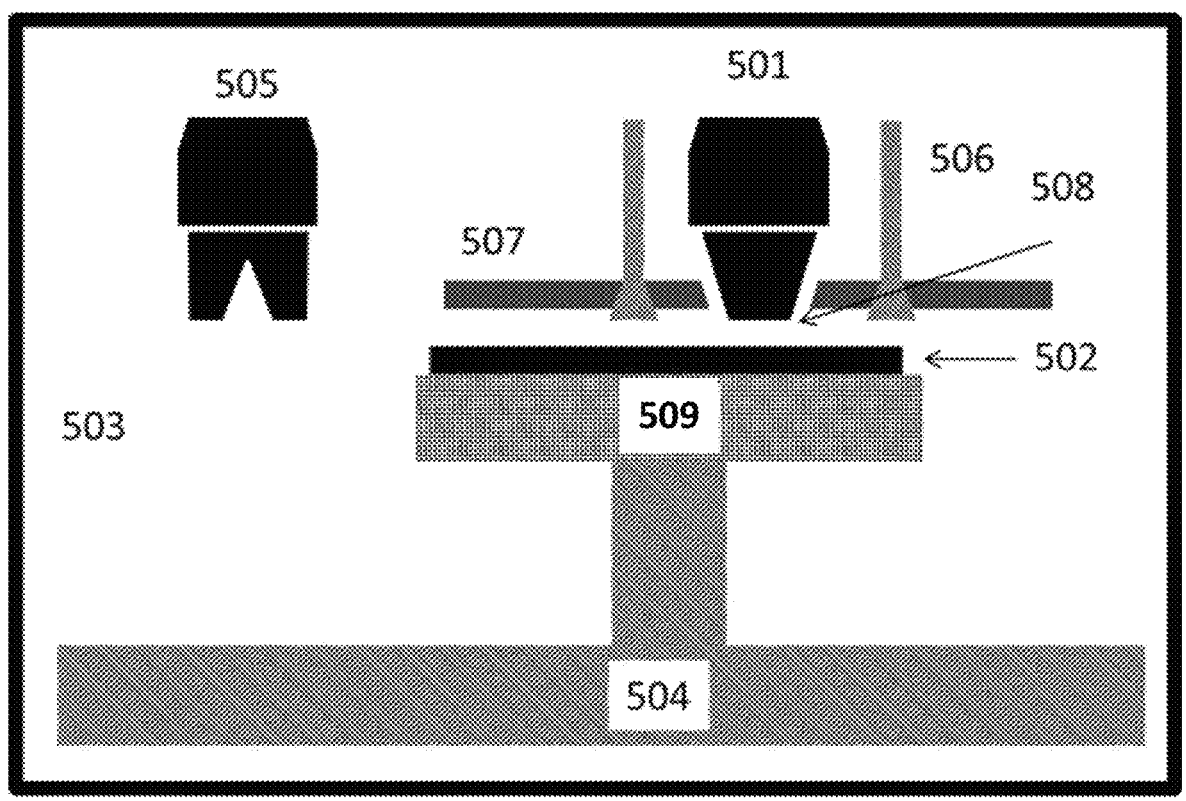
FIG. 5 shows a COP reactor of a COP system according to an embodiment of the disclosed subject matter.

FIG. 5 shows a COP reactor of a COP system according to an embodiment of the disclosed subject matter. The COP system may include a gas distribution manifold 501 (henceforth referred to as the COP head) disposed over a deposition substrate 502 in a cold-walled process chamber 503 that is sealed to permit operation at sub-atmospheric pressure and eliminate outside contamination. The COP head 501 shown in FIG. 5 may deposit material over an area that is much wider than it is deep, and may use its translational motion relative to the substrate to achieve coverage over a large surface area. Configurations other than linear, such as square, round or an arbitrary shape are possible. The arrangement shown in FIG. 5 may be a cross section normal to the long axis of the COP head 501. The substrate 502 may typically be glass, although metal, ceramic, polymer, or semiconductor substrates may be used instead. The substrate 502 may be a flat plate, as shown in FIG. 5, or it may be a section of web in a roll-to-roll process. The chamber 503 may include a device to move the substrate 502 relative to the print head a direction orthogonal to both the long axis of the COP head 501 and the substrate normal. The device may be a robotic substrate stage 504 that may include platen 509 or may be moving rollers in a roll-to-roll process. Alternately, the COP head 501 can be moved while the substrate 502 remains stationary. The chamber 503 may have additional equipment 505 unrelated to the aforementioned COP deposition process, including but not limited to, COP heads 501 depositing dissimilar materials, OVJP print heads, or thin film characterization equipment that acts on the same substrate 502.

The chamber 503 may be filled with inert gas, which may be argon, at a pressure of between 50 and 760 Torr. The region around the COP head 501 may be surrounded with nozzles 506 that may flood the deposition region with ultra-pure confinement gas, which may be argon. COP may deposit many of the same materials as vacuum thermal evaporation (VTE) without using an ultrahigh vacuum to maintain process cleanliness. Embodiments of the disclosed subject matter may have a substantially lower cost of ownership than existing organic thin film growth tools of comparable capability, since ultrahigh vacuum equipment may be expensive to build, operate, and maintain. Operating in a non-high vacuum environment, such as in the embodiments of the disclosed subject matter, may have other advantages, since technologies reliant on the presence of a gaseous medium, such as convective cooling, ultrasonic sensing, and vacuum fixturing may be used. Solvent based deposition processes such as slot die coating or inkjet printing may be potentially be integrated into the same chamber as the COP head 501.

Chamber gasses may transport heat away from the heated portions of the COP head 501, and may potentially create hot spots on the substrate 502 or chamber 503. This may be mitigated through the use of a chiller plate 507 between the COP head and the substrate. The chiller plate 507, disclosed in U.S. Patent Publn. No. 2012/097495, may place an actively cooled metal plate between the upper portions of the COP head 501 and the substrate 502. The chiller plate 507 may include a cutout through which the tip of the COP head 501 protrudes. The gap 508 between the COP head 501 and the substrate 502, henceforth referred to as the fly height, may be a well-controlled value of approximately 1 mm.

Figure 6:
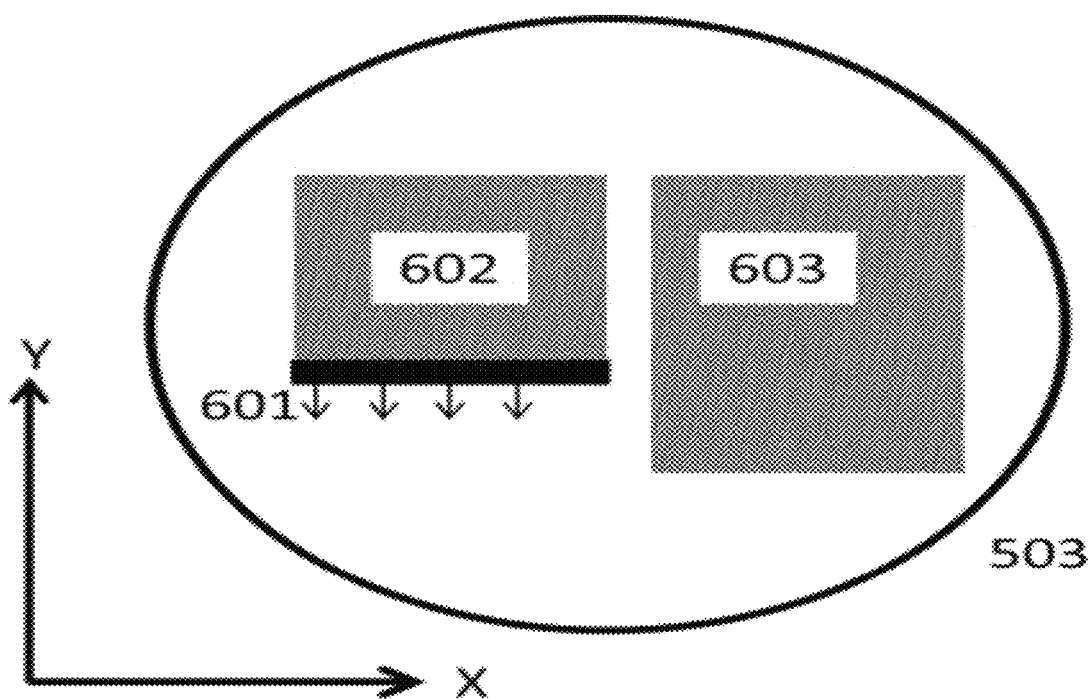
FIG. 6 shows a deposition of an organic thin film on a substrate using a COP head according to an embodiment of the disclosed subject matter.

The COP head 501 may operate differently from large area deposition processes such as VTE by depositing organic material on relatively small areas of a substrate at a time. FIG. 6 shows a deposition of an organic thin film on a substrate using a COP head according to an embodiment of the disclosed subject matter. In FIG. 6, the printing process may be on the substrate in a face-up orientation. The substrate may move relative to the COP head, so the region of substrate under the COP head moves as well. The COP print head may generate a wide, thin region of organic vapor deposition 601 underneath it, and may be trailed by a continuous film 602. The motion of the deposition region in a direction mutually orthogonal to the substrate normal and long axis of the deposition region, referred to as they y axis, may form a wide (>1 cm) stripe of organic thin film on the substrate. If additional stripes 603 are desired, the substrate may be moved parallel to the long axis of the deposition region, referred to as the x axis, between y axis passes. Similarly, wider stripes may be formed by drawing a raster pattern, with multiple y axis passes offset along the x axis.

Figure 7:
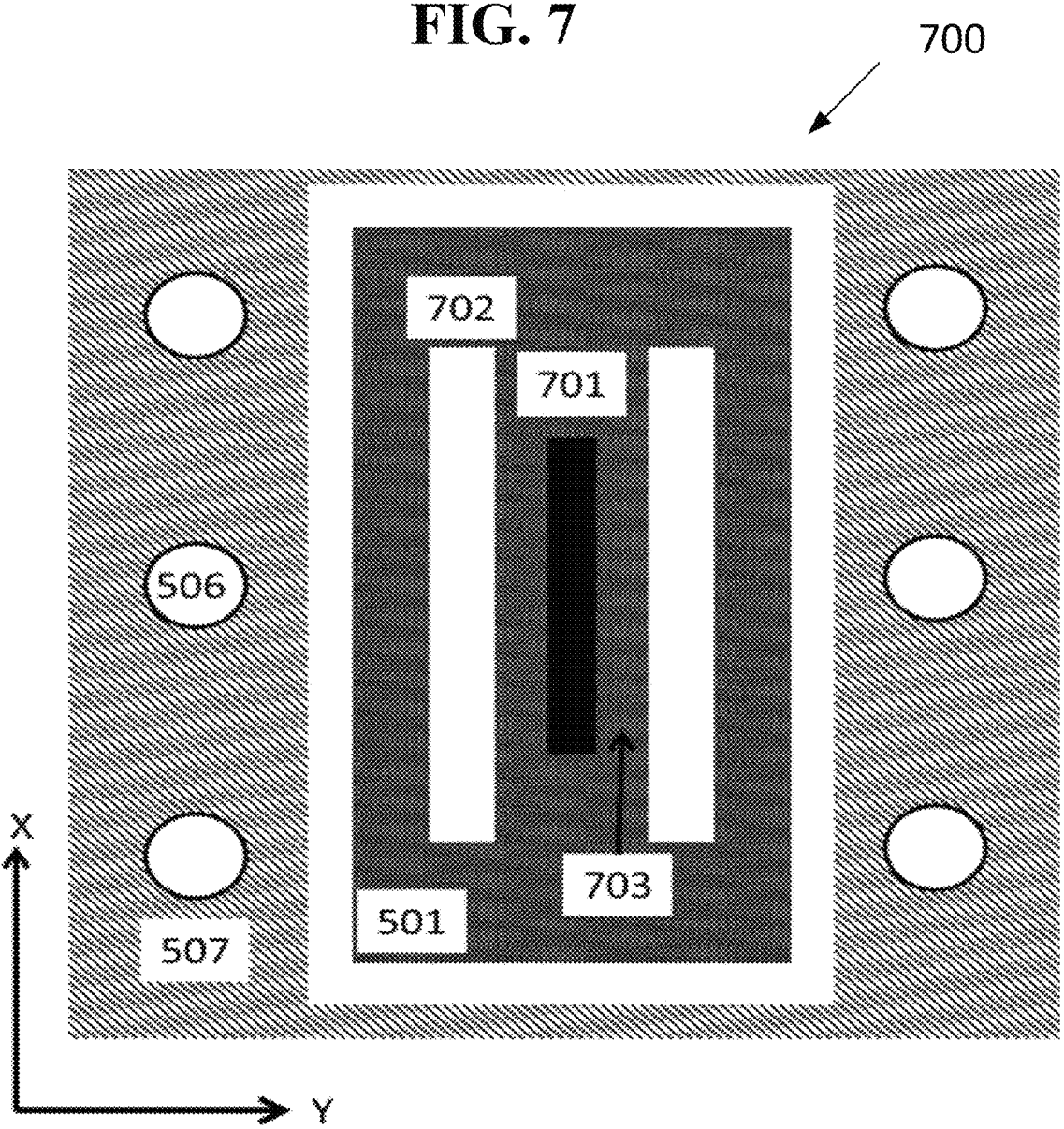
FIG. 7 shows a substrate-facing tip of a COP head according to an embodiment of the disclosed subject matter.

FIG. 7 shows a substrate-facing tip of a COP head according to an embodiment of the disclosed subject matter. That is, FIG. 7 shows the COP head 501 having aperture assembly 700 as viewed from the perspective of the substrate normal. A long narrow delivery aperture 701 (also referred to as a deposition aperture throughout) may eject organic vapor entrained within an inert carrier gas, henceforth referred to as delivery gas, onto the substrate. The mixture of delivery gas and organic vapor may impinge on the substrate and the organic vapor condenses on the substrate. Delivery gas and uncondensed organic vapor may be removed or sucked out of the deposition zone, along with a portion of the gas ambient surrounding COP head through exhaust apertures 702. The gas ambient may be referred to confinement gas and may act to protect the chamber environment from the COP head 501 by establishing a net convective current towards the print head that prevents organic material from diffusing away from the COP head and throughout the chamber. The confinement gas in the embodiments of the disclosed subject matter may be similar to the confinement gas disclosed in U.S. Patent Publn. No. 2015/0376797. The delivery aperture 701 and exhaust aperture 702 may be surrounded by a spacer 703. As in FIG. 4, the COP head 501 may be surrounded by a chiller plate 507 that may contain distribution nozzles 506 for the confinement gas. By distributing the confinement gas proximally to the COP head 501, it may be possible to isolate the COP head 501 from the surrounding chamber ambient so that all streamlines of flow terminating at the COP head 501 originate in the confinement gas distribution nozzles 506. This dedicated confinement gas flow may be drawn from an ultrapure source to minimize substrate exposure to residual gases such as $O_2$ and $H_2O$ or remnants of a different deposition that may be present in other regions of the chamber. The confinement gas may be supplied by the chamber ambient and may flow between the cold plate and substrate towards the print head.

Figure 8:
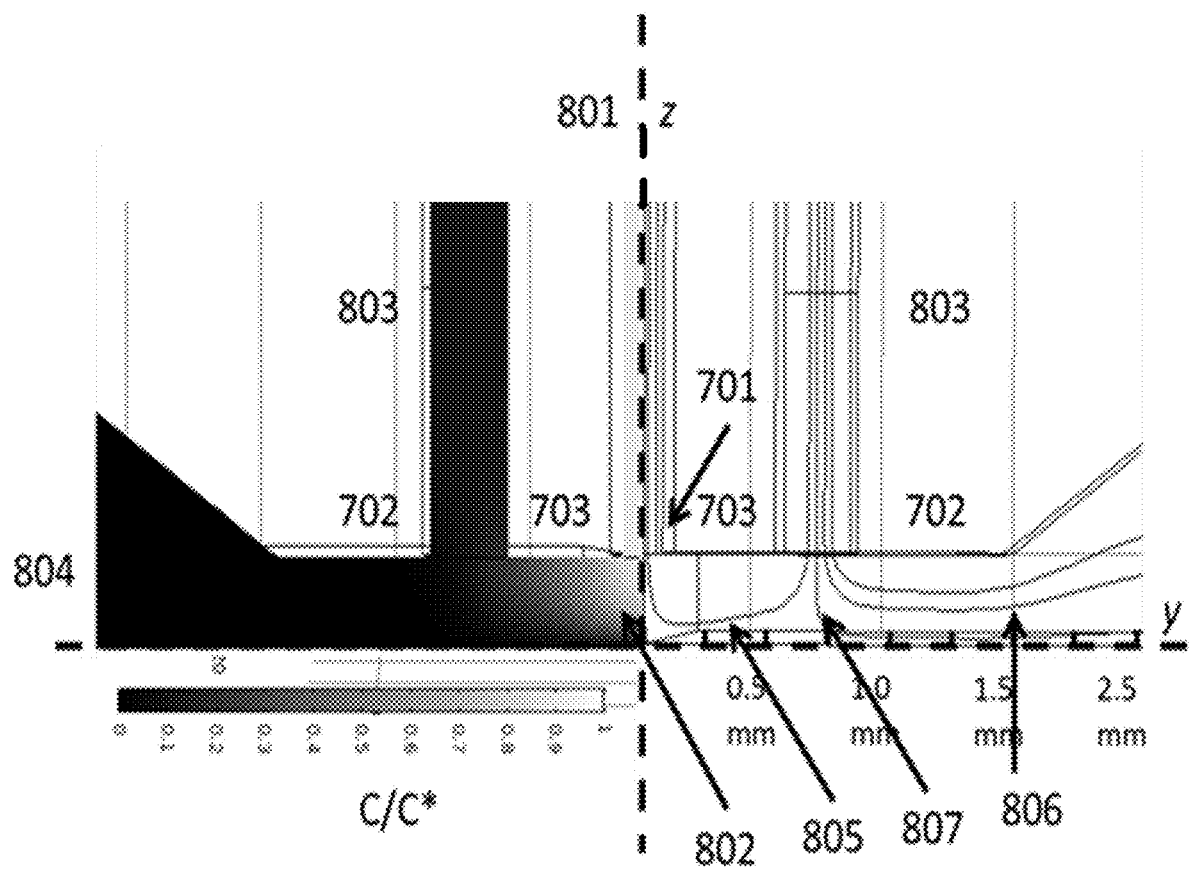
FIG. 8 shows a simulated organic vapor concentration profile (left) and lines of gas flow (right) for the gap between a COP head and a substrate according to an embodiment of the disclosed subject matter.

Simulation of this process using COMSOL Multiphysics CFD software predicts the interaction of the delivery and confinement gas streams and the anticipated deposition rates throughout the chamber. FIG. 8 shows a simulated organic vapor concentration profile (left) and lines of gas flow (right) for the gap between a COP head and a substrate according to an embodiment of the disclosed subject matter. That is, FIG. 8 shows the simulated results for a cross section normal to the linear (x) axis of the COP head. The grayscale plot on the left hand side may show the concentration of organic vapor within the deposition zone. Light regions may indicate regions of high organic vapor saturation C/C*, where C is the concentration of organic vapor and C* is the concentration, presumed to be the saturation concentration, at the upstream portion of the delivery channel 801. The delivery channel may terminate in a delivery aperture 701 at its downstream lower portion. A large gradient in the concentration field 802 may be present beneath the delivery aperture 701 due to the condensation of organic vapor on the substrate. Organic vapor that spreads laterally beyond the spacer 703 may be captured by the exhaust aperture 702 and removed from the deposition zone through an exhaust channel 803. The concentration of organic vapor in the exhaust channel 803 may be low, due to both the adsorption of organic vapor to the substrate and the dilution of the delivery flow by confinement gas. Confinement gas may flow from the outside edge of the gap between the COP head 501 and substrate 804. The confinement gas may carry no organic vapor.

The flow streamlines of delivery gas 805 and confinement gas 806 may be depicted on the right hand side of FIG. 8. The two flows 805, 806 may move antiparallel to each other in the deposition region. The flows may meet along a virtual boundary called the stagnation plane 807 where the horizontal (y) axis velocity of each flow may be 0. The inward movement of the confinement gas 806 may prevent organic vapor from diffusing substantially beyond the stagnation plane. The delivery and confinement flows 805 and 806 along the stagnation plane may both accelerate vertically towards the exhaust aperture as they approach the stagnation plane 807.

Figure 9A:
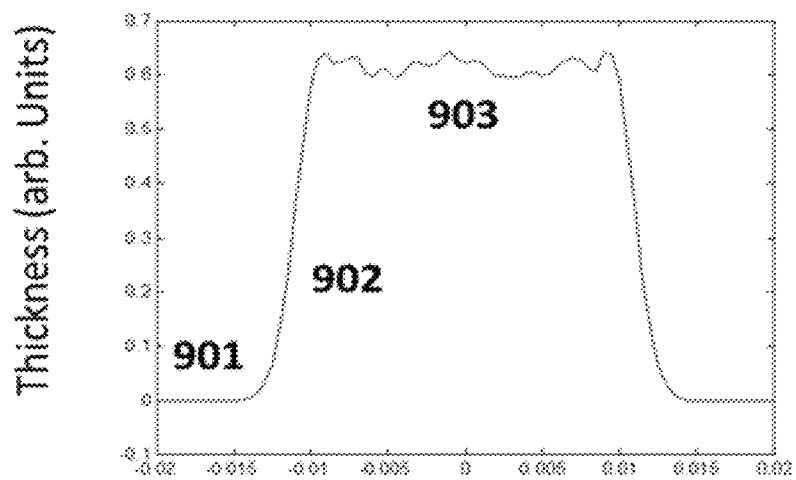
FIGS. 9A-9B show average deposition thickness for a simulated COP head as a function of distance from the centerline along its width axis (top) and depth axis (bottom) according to an embodiment of the disclosed subject matter.
Figure 9B:
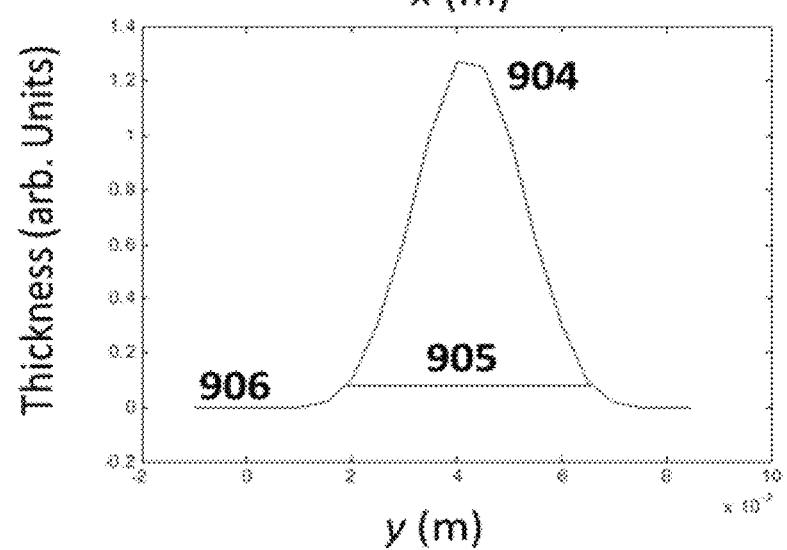

FIGS. 9A-9B show average deposition thickness for a simulated COP head as a function of distance from the centerline along its width axis (top) and depth axis (bottom) according to an embodiment of the disclosed subject matter. The deposition profiles may be predicted along a line of substrate for a COP print head with a 20 mm long by 0.5 mm wide delivery aperture, where helium delivery gas and confinement gas is assumed. The delivery gas flow rate may be 100 sccm and the exhaust flow rate may be 200 sccm (standard cubic centimeters per minute). The chamber ambient may be 200 Torr and 20° C., while the COP head may be heated to 300° C. The delivery aperture may be 0.5 mm wide, the exhaust apertures may be 1 mm wide. The distance between the delivery aperture and exhaust aperture may be 0.5 mm.

The deposition thickness along the width of the COP head may be plotted along the x axis as a function of distance from the centerline as shown in FIG. 9A. There may be little deposition in regions not covered by the delivery aperture 901, however deposition thickness may rise sharply 902 for regions under the depositor. The center of the profile may be a broad mesa 903 over which thickness uniformity of better than ±3% can be expected for the deposited stripe of organic material over the 20 mm width of the COP head delivery aperture. In embodiments of the disclosed subject matter, multiple stripes may be stitched together by offsetting multiple passes along the x axis for wider films.

FIG. 9B shows the distribution of deposition thickness on the substrate as a function of y axis position centered along the delivery aperture. The deposition peaks 904 may be directly underneath the delivery aperture. The profile may be roughly Gaussian with a 6σ width 905 of about 5 mm, corresponding to slightly more than the width of the deposition aperture, spacers and exhaust apertures. There may be virtually no organic material deposited beyond the exhaust apertures 906, implying that no organic material is available for deposition outside of the region bordered by the exhaust apertures. The rest of the chamber may be effectively isolated from the organic vapor used in the COP process.

Figure 10:
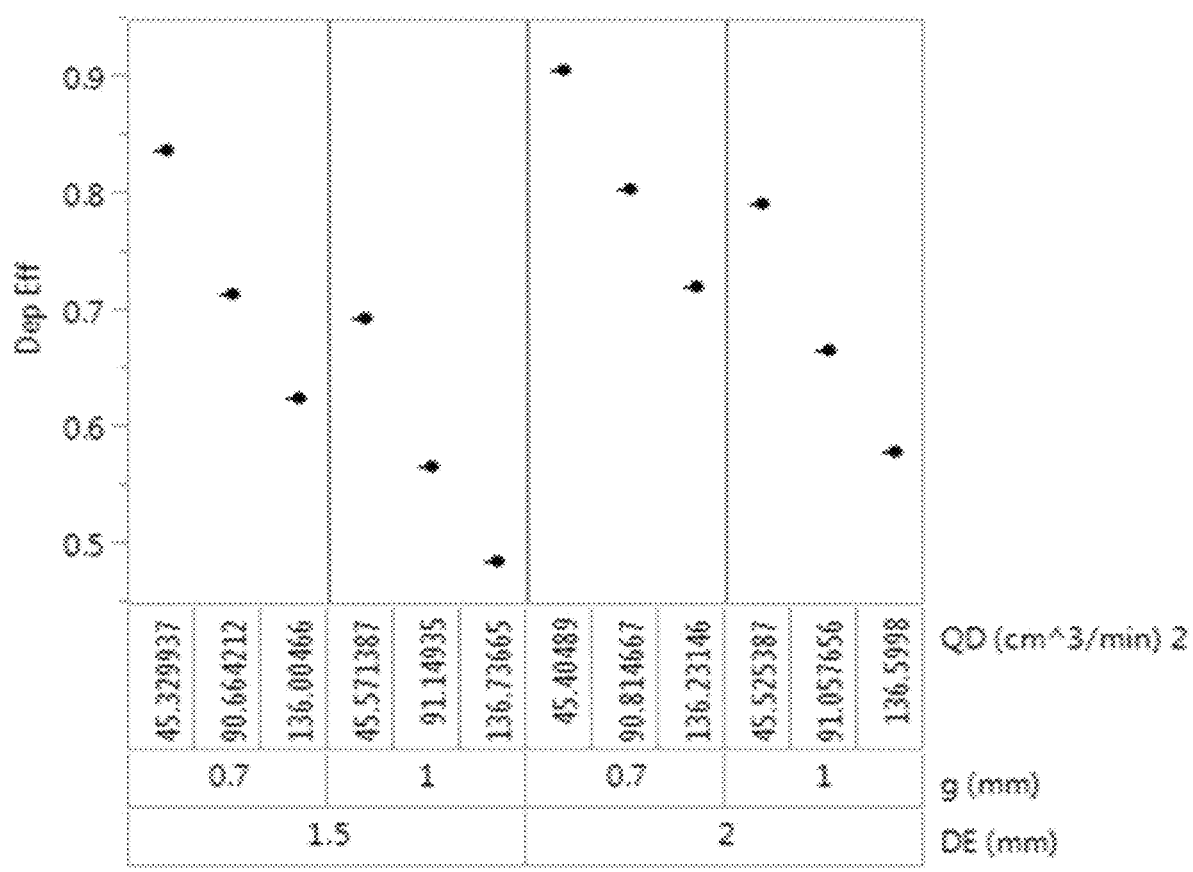
FIG. 10 shows a material utilization efficiency of a simulated COP head as a function of multiple process variables according to an embodiment of the disclosed subject matter.

FIG. 10 shows a material utilization efficiency of a simulated COP head as a function of multiple process variables according to an embodiment of the disclosed subject matter. In particular, FIG. 10 shows the expected deposition efficiency, meaning the fraction of organic material that may be ejected from the delivery aperture that may adsorbs on the substrate, as a function of the rate of delivery gas flow QD, fly height between the COP head and substrate g, and exhaust spacer width DE. Flow through the exhaust channel may be assumed to be 2×QD in all cases. Deposition efficiency may be between 50 and 90% in most cases. In general, deposition efficiency may increase for reduced delivery flow rates, since organic vapor has more time to diffuse onto the substrate in a slower gas flow. This may be at the expense of overall deposition rate, which may scale with delivery flow rate. Deposition efficiency may increase with decreased fly height, since the gap that organic vapor crosses to reach the substrate may become smaller. While very efficient operation may be achieved by bringing the COP head into close proximity with the substrate, the minimum fly height may depend on factors like the thermal load that may be handled by the substrate or the mechanical tolerances of process tool. Deposition efficiency may be dependent on the width of the DE spacer. Wider spacers may permit more efficient deposition by increasing the path length of the delivery flow and therefore the amount of time for organic vapor molecules to adsorb onto the substrate. The maximum width of the DE spacer may be determined by thermal and mechanical considerations as well.

Figure 11:
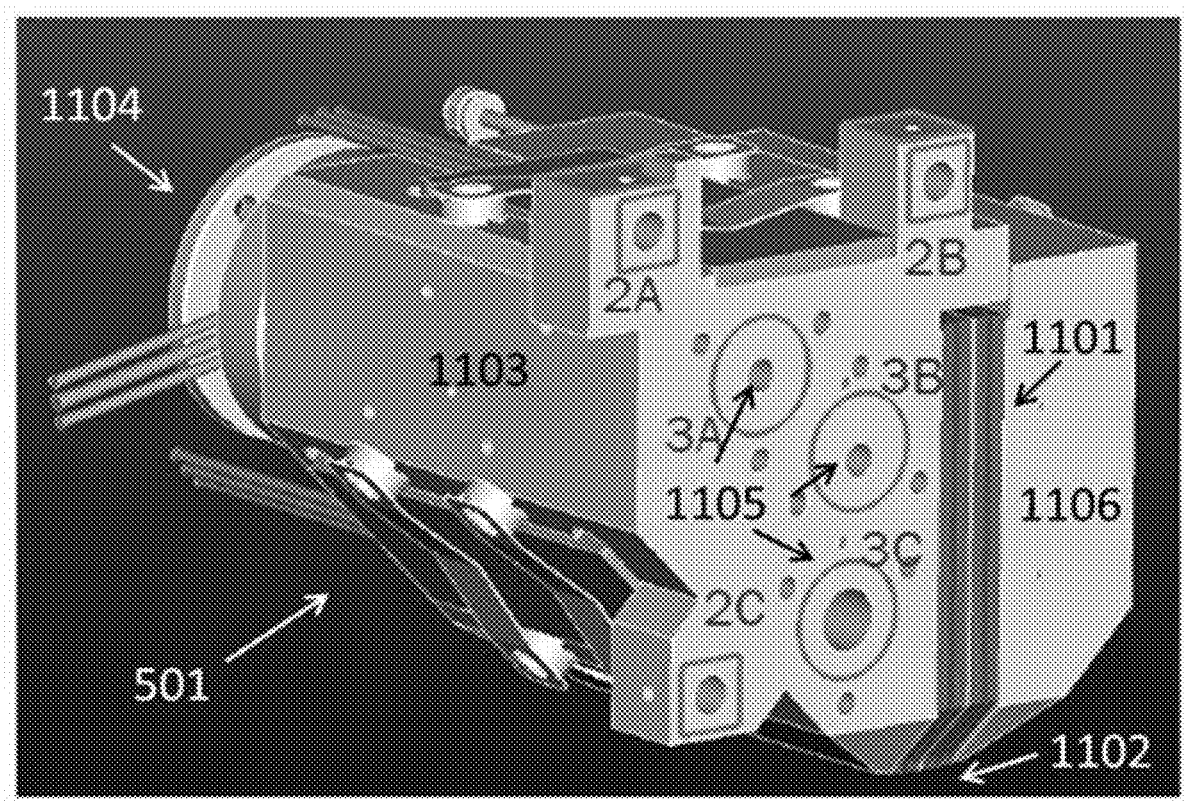
FIG. 11 shows a physical model of a COP head according to an embodiment of the disclosed subject matter.

FIG. 11 shows a physical model of a COP head according to an embodiment of the disclosed subject matter. The head may include a clamp having a stack of metal foil plates 1101 that may combine to form a gas distribution manifold. The plates may include cutouts so that the gaps between layers of the stack form the delivery and exhaust apertures shown in FIG. 6 at the lower tip of the stack 1102 facing the substrate. This design may be analogous to the plate stacking for construction of OVJP print heads disclosed in U.S. Pat. No. 9,583,707 by Universal Display Corp. The major side of the clamp 1103 may include channels to distribute delivery gas and remove exhaust from the stacked sheet manifold. The delivery gas path may include an internal cavity containing a crucible of condensed organic material that may act as a sublimation oven and may provide a source of organic material. The crucible may be accessed through a port 1104 on the side of the head. Placing the organic vapor source within the COP head may minimize the heated path length of organic material, simplifying thermal management of the system and making it more self-contained. The major side of the clamp may be ported with vias 1105 connecting the COP head to process gas streams to provide regulated delivery and dilution flows, as well as a negative pressure exhaust stream. The metal plates 1101 may be held to the major side of the clamp by pressure from the minor side of the clamp 1106.

Figure 12:
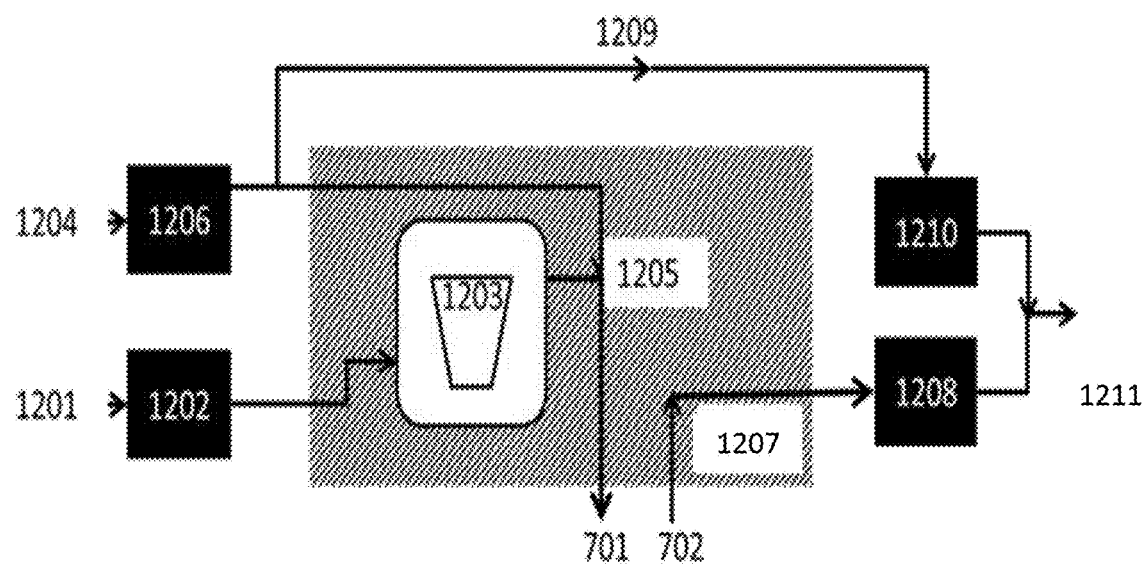
FIG. 12 shows process flow diagram of a COP head according to an embodiment of the disclosed subject matter.

FIG. 12 shows process flow diagram of a COP head according to an embodiment of the disclosed subject matter. The delivery flow stream 1201 may be metered by a mass flow controller (MFC) 1202. The delivery flow may enter the organic source oven within the COP head, where it may pick up organic vapor from evaporable material inside of a crucible 1203. The delivery flow may join up with the dilution flow 1204 at a tee 1205 within the COP head downstream of the source oven. Dilution gas flow may be regulated by an MFC 1206. The delivery and/or dilution flow may pass through the delivery aperture of the COP head 701. Exhaust flow 1207 may enter the COP head and pass through a regulator 1208, either a mass flow controller or upstream pressure controller, before being drawn into a vacuum reservoir 1211.

The dilution flow line may act as a bypass, shorting the organic vapor source to the vacuum reservoir, skipping the delivery and exhaust apertures. When it is operated in this mode, the MFCs regulating inflow 1202, 1206 may be closed and flow through the portions of the dilution line within the COP head reverses. Flow from the dilution line may travel down a bypass line 1209 to an open MFC 1210 connected with a vacuum reservoir. When the COP head is in bypass mode, the downstream MFC may generally have a higher setpoint than the MFC regulating delivery flow. This may create a reverse flow through the delivery channel that prevents leakage of organic vapor onto the substrate. The bypass may be used to turn off organic deposition while keeping the organic source in a hot, vapor-producing state. Because source operation is dependent on absolute pressure, while flows are governed by smaller changes in relative pressure, the bypass function may be used to rapidly modulate deposition on and off while minimizing the transient disturbances experienced by the organic vapor source. As an alternative to regulating the flow through the bypass circuit, the pressure controllers may be used rather than mass flow controllers. In this case, the pressure set point of the bypass pressure controller may be set to a value lower than the chamber pressure to establish flow from the chamber through the deposition aperture to the vacuum reservoir. The use of a bypass may prevent contamination of the chamber when the COP head is not in use and any unused material may be collected and recycled.

Figure 13:
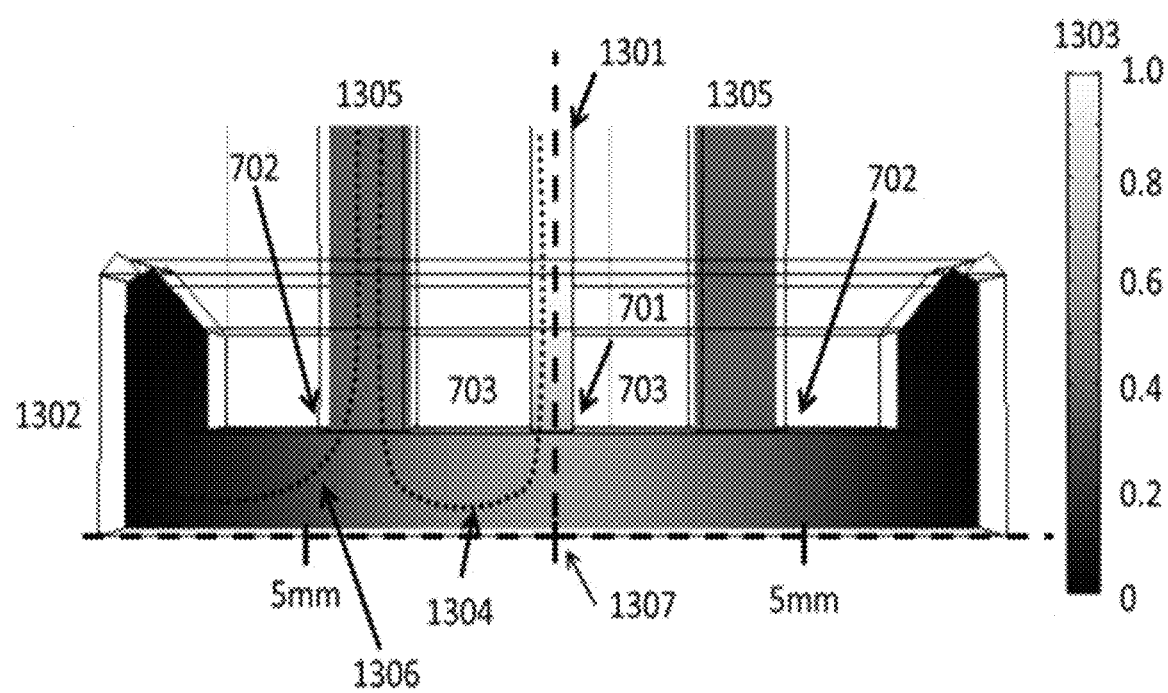
FIG. 13 shows a plot of helium fraction within a gap between a COP head and a substrate according to an embodiment of the disclosed subject matter.

FIG. 13 shows a plot of helium fraction within a gap between a COP head and a substrate according to an embodiment of the disclosed subject matter. Light delivery gas, such as helium, and a heavy confinement gas, such as argon may be used. The mole fraction of helium within the deposition region is shown in FIG. 13. Gas at the upstream portion of the delivery channel may have a helium mole fraction $X1=1$ 1301. The gas at the outer periphery of the COP head may be argon, so $X1=0$ at the outside boundary 1302 where the confinement gas may be sourced. The distribution of helium is shown on the left-hand side of FIG. 13, with a gray scale 1303 indicating mole fraction of helium. Gas flows may be relatively slow compared to the rate of diffusion of helium in argon, so gas transport may be dominated by diffusion. The mole fraction of helium may follow a smooth gradient along the delivery gas flow path 1304, from the top of the delivery channel through the delivery aperture 701, under the delivery-exhaust spacer 703, and out through the exhaust aperture 702. Despite the addition of argon, the Péclet number may be still relatively low, such that $Pe=0.1-1$. There may be a substantial diffusive mixing between the delivery and confinement gas streams. Gas within the exhaust channel 1305 may be well mixed and may have a mole fraction of $X1=0.5$, reflecting the 1:1 ratio of delivery and confinement flows. The mole fraction of helium along the confinement gas flow path 1306 may vary from $X1=0$ at the confinement gas source to $X1=0.5$ in the exhaust channel.

Figure 14:
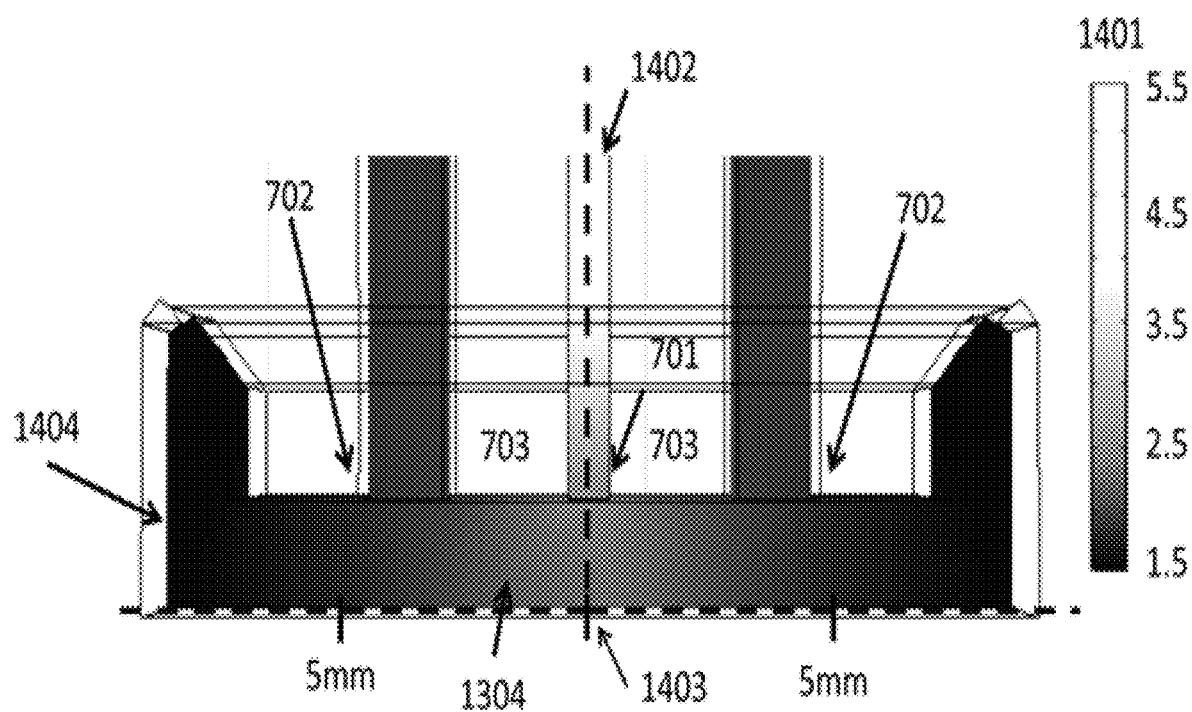
FIG. 14 show a plot of and the value of organic diffusivity within the gap between a COP head and a substrate according to an embodiment of the disclosed subject matter.

FIG. 14 show a plot of and the value of organic diffusivity within the gap between a COP head and a substrate according to an embodiment of the disclosed subject matter. The diffusivity of organic vapor in the gas mixture shown in FIG. 14 may be determined by kinetic theory (Deen 1998) and may be dependent on the mole fraction of helium (Fairbanks and Wilke, 1950). The gas diffusivity may be expressed by a grayscale 1401 with units of $10^{-5}$ m$^2$/s. The diffusion of organic vapor inside the delivery channel 1402 may be very rapid, however convective transport may dominate in this region. The elevated concentration of helium under the delivery aperture 1403 may increase the rate at which organic vapor diffuses to the substrate. While diffusivity scales primarily with helium mole fraction, it may become slower closer to the substrate. This may be because diffusivity depends on temperature, and the cooled substrate may create a temperature gradient between itself and the COP head. Using helium as a delivery gas may mitigate the reduction in diffusive organic vapor transport near the substrate. Diffusivity of organic material in the incoming argon confinement flow 1404 may be about 25% of the delivery flow. The lower diffusivity of organic vapor in the confinement flow may make it more effective at blocking the spread of organic vapor beyond the confines of the COP head. Because convection predominates over diffusion in the confinement gas, any organic material leaving the deposition zone is drawn into the exhaust aperture 702 by the confinement gas flow.

A preferred embodiment of COP may include co-deposition capability. A co-deposition COP head may contain, or may be in fluid communication with, multiple organic vapor sources. Effluent vapors from these multiple sources may mix upstream of the delivery channel and deposit onto the substrate. The fraction of organic vapor from each source in the mixture may be determined by a combination of the delivery gas flow rate through each source and the temperature to which each source crucible is heated.

A COP with co-deposition capability may be useful for growing graded organic thin films. In a graded film, the concentration of components in a multicomponent film may be graded across the thickness of the film. For example, the concentration of dopant can be varied across the depth of the emissive layer of an OLED to increase efficiency and lifetime (Erickson and Holmes 2014). Conventional deposition techniques may deposit on the whole substrate at once, so controlling a graded deposition may be difficult. Since COP prints a portion of a substrate at a time, it may build a graded layer by evenly printing a desired region with a thin film of uniform composition, and may print over the same region with uniform thin films of monotonically varying composition until a layer with the desired thickness and component grading is deposited. The sequential films stacked to make the graded layer may be deposited by changing the process variables of a single COP head with each pass. Alternately, multiple COP heads, each depositing the same material set in different ratios may pass over the substrate in series.

Figure 15:
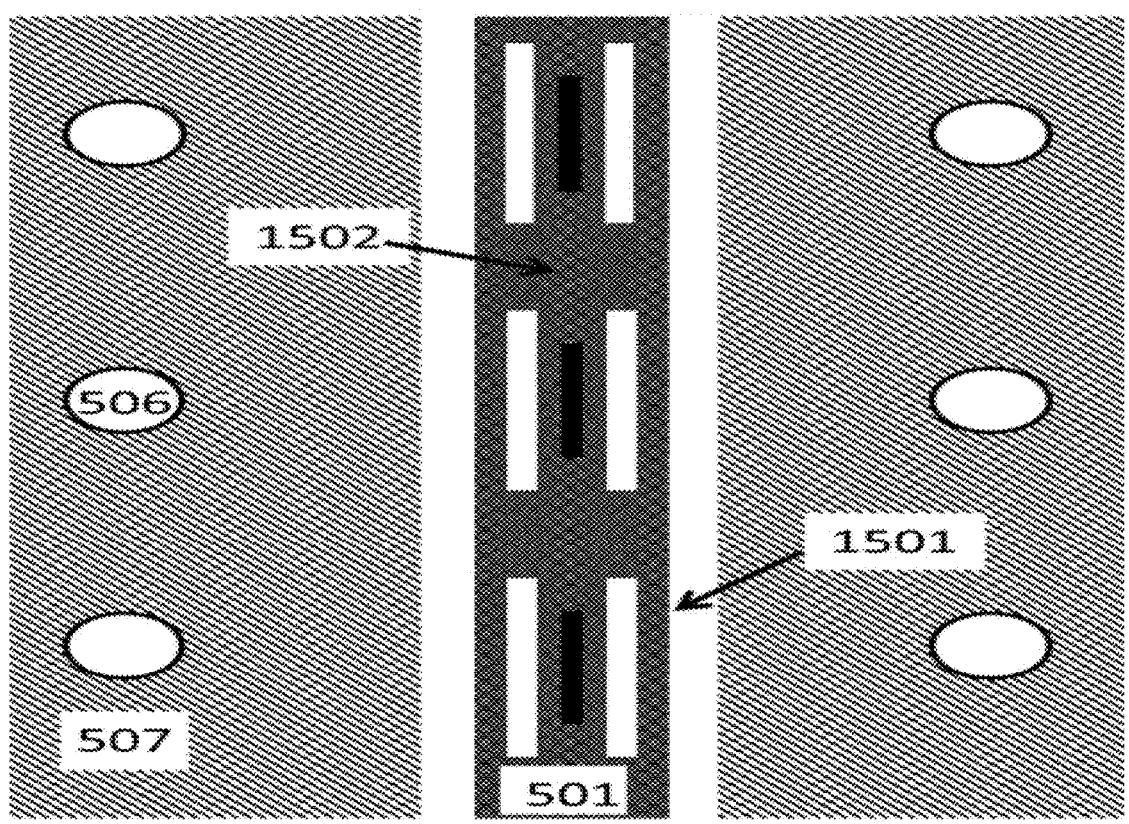
FIG. 15 shows a COP head with multiple sets of delivery and exhaust apertures arranged in a linear array according to an embodiment of the disclosed subject matter.

FIG. 15 shows a COP head with multiple sets of delivery and exhaust apertures arranged in a linear array according to an embodiment of the disclosed subject matter. Sets of delivery and exhaust apertures 1501, as shown singly in FIG. 5, may be arranged on a single COP head 501. These depositor units may be separated along the length of the head by spacers 1502. As shown in FIG. 5 and described above, the COP head 501 may be surrounded by a chiller plate 507 and dedicated confinement gas sources 506. This configuration may have many potential applications. For example, the widths and positions of spacers may be chosen to avoid depositing organic thin film on specific areas of a substrate when the COP head passes over them. This may permit mask-free deposition by COP on substrates with features like encapsulation zones or busline to cathode interconnects. In another application, adjacent depositors may each overwrite a given printed zone on multiple passes. If each depositor deposits a different material mixture, a graded or multilayer film may be produced.

The embodiments of the disclosed subject matter present a confined organic printing (COP) source which may deposit material over a controllable, localized area of a substrate, without the use of masks to define patterned areas. Deposition uniformity and selectivity may be achieved by control of the environment within a small region of the chamber moving relative to the substrate rather than by creating a severe environment within the entire chamber. The chamber may not become contaminated with organic vapor. The chamber may not need to be hot walled and may contain a variety of additional equipment for additional process steps.

The chamber may not operate at high vacuum ($<10^{-6}$ Torr), but at a higher pressure ($>10$ Torr). This may permit non-vacuum compatible items to be incorporated into process design. Additionally, COP may facilitate the fabrication of devices having a large area and/or graded organic thin films.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A system comprising:
   one or more print heads that eject organic vapor laden gas into a cold-walled chamber and withdraw chamber gas,
   one or more distribution nozzles disposed on a chiller plate that surrounds the one or more print heads, wherein the one or more distribution nozzles output confinement gas to isolate the one or more print heads from the chamber ambient,
   wherein vapor ejected from the one or more print heads is incident on, and condenses onto, a deposition surface within the cold-walled chamber, and wherein the deposition surface moves relative to the one or more print heads in a direction orthogonal to a platen normal and a linear extent,
   wherein the volumetric flow of gas withdrawn by the one or more print heads from the cold-walled chamber is greater than the volumetric flow of gas injected into the cold-walled chamber by the one or more print heads,
   wherein the net outflow of gas from the cold-walled chamber through the one or more print heads prevents organic vapor from diffusing beyond the extent of the gap between the one or more print heads and a deposition surface, and
   wherein the one or more print heads are configured so that long axes of delivery and exhaust apertures are perpendicular to a print direction.

2. The system of claim 1, wherein the vapor is ejected from the one or more print heads with a vapor distribution manifold that is formed from perforated sheets of metal.

3. The system of claim 1, wherein the vapor is ejected from the one or more print heads with a vapor distribution manifold,
   wherein the vapor distribution manifold is joined to a surrounding chamber wall via one or more connections, and wherein the connections are not heated.

4. The system of claim 1, further comprising:
   a cold-walled process chamber that includes a vapor distribution manifold and an aperture assembly of the one or more print heads that both ejects the organic vapor laden inert delivery gas into the cold-walled process chamber and withdraws chamber gas,
   wherein the vapor distribution manifold ejects vapor that is incident on, and condenses onto, a deposition surface within the cold-walled process chamber, and
   wherein the deposition surface is configured to move relative to the print head in a direction orthogonal to the deposition surface normal and a linear extent of the vapor distribution manifold.

5. The system of claim 4, wherein the ejected vapor is incident on, and condenses onto, the deposition surface within the cold-walled process chamber without a shadow mask.

6. The system of claim 1, wherein the deposition surface is a platen.

7. The system of claim 6, wherein the platen is configured to hold a substrate.

8. The system of claim 6, wherein the platen is configured to be cooled by a cooling device.

9. The system of claim 1, further comprising:
a deposition aperture to deposit gaseous precursors or substances as deposition materials, wherein the deposition materials are confined to a volume defined by the area under the deposition apertures by a confining flow and localized exhaust.

10. The system of claim 9, wherein a shape of the deposition aperture matches an unmasked area of a substrate on which the deposition materials are deposited.

11. The system of claim 10, wherein the unmasked area defines an active device.

12. The system of claim 10, wherein the unmasked area has been previously processed.

13. The system of claim 10, wherein a masked area protects the substrate from the deposition materials.

14. The system of claim 13, wherein the masked area is removed after the deposition material are deposited, wherein the removal of the masked area is by subsequent processing.

* * * * *